United States Patent
Yen et al.

(10) Patent No.: US 12,259,818 B2
(45) Date of Patent: Mar. 25, 2025

(54) FLASH MEMORY CONTROLLER AND DATA PROGRAMMING METHOD

(71) Applicant: Silicon Motion Inc., Hsinchu (TW)

(72) Inventors: Hsiao-chang Yen, Hsinchu (TW); Tsu-han Lu, Hsinchu (TW)

(73) Assignee: Silicon Motion Inc., Jhubei (TW)

( * ) Notice: Subject to any disclaimer, the term of this patent is extended or adjusted under 35 U.S.C. 154(b) by 0 days.

(21) Appl. No.: 18/432,096

(22) Filed: Feb. 5, 2024

(65) Prior Publication Data

US 2024/0403221 A1    Dec. 5, 2024

(30) Foreign Application Priority Data

Jun. 2, 2023  (TW) ................. 112120776

(51) Int. Cl.
*G06F 12/0877* (2016.01)
*G06F 12/02* (2006.01)

(52) U.S. Cl.
CPC ...... *G06F 12/0877* (2013.01); *G06F 12/0238* (2013.01)

(58) Field of Classification Search
CPC ............. G06F 12/0238; G06F 12/0246; G06F 12/0877
See application file for complete search history.

(56) References Cited

U.S. PATENT DOCUMENTS

| | | | |
|---|---|---|---|
| 7,454,586 B2 | 11/2008 | Shi et al. | |
| 11,331,924 B2 | 5/2022 | Gardner et al. | |
| 11,494,261 B2 | 11/2022 | Achtenberg et al. | |
| 2015/0046637 A1 | 2/2015 | Chien et al. | |
| 2015/0178001 A1* | 6/2015 | Chien ................... | G06F 3/0679 711/102 |
| 2019/0043567 A1* | 2/2019 | Khakifirooz .......... | G06F 3/0679 |
| 2020/0319827 A1* | 10/2020 | Alsasua ................ | G06F 3/0679 |
| 2021/0342100 A1 | 11/2021 | Cerafogli et al. | |

* cited by examiner

*Primary Examiner* — Aracelis Ruiz (74) *Attorney, Agent, or Firm* — Nathan & Associates; Menachem Nathan (57) ABSTRACT

A flash memory controller and a data programming method are provided. The flash memory controller includes a control logic circuit and a processor. The control logic circuit is coupled to a first chip-enable-signal controlled area of a flash memory through a channel to transmit data and commands. The processor controls the control logic circuit to transmit a first command and a second command to the first chip-enable-signal controlled area through the channel. The first command is configured to instruct the first chip-enable-signal controlled area to write stored data and read operating temperature information. In response to the transmission of the second command, the processor controls the control logic circuit to receive the operating temperature information from the first chip-enable-signal controlled area.

20 Claims, 5 Drawing Sheets

FLASH MEMORY CONTROLLER AND DATA PROGRAMMING METHOD

CROSS REFERENCE TO RELATED APPLICATIONS

This application claims priority to Taiwan Application Serial No. 112120776, filed Jun. 2, 2023, the disclosure of which is incorporated herein by reference.

FIELD OF DISCLOSURE

The present disclosure relates to a storage device, in particular to a flash memory controller and a data programming method.

BACKGROUND

Data reliability of memory devices will be affected by temperature. For example, a temperature of a memory device will increase as a data access speed of the memory device increases. If the temperature is higher than an allowable operating range, unpredictable errors are prone to occur when executing program (read or write) commands, and even cause the memory device to fail.

Accordingly, it is necessary to provide a flash memory controller and a data programming method to solve the above technical problems.

SUMMARY OF DISCLOSURE

In order to solve the above-mentioned problems in the prior art, an object of the present disclosure is to provide a flash memory controller and a data programming method, which can make the flash memory that performs a program operation quickly return operating temperature information.

In a first aspect, the present disclosure provides a flash memory controller for controlling a flash memory. The flash memory includes a first chip-enable-signal controlled area. The flash memory controller includes a control logic circuit and a processor. The control logic circuit is coupled to the first chip-enable-signal controlled area of the flash memory through at least one channel to transmit data and commands. The processor is coupled to the control logic circuit to access the first chip-enable-signal controlled area on the channel through the control logic circuit. The processor controls the control logic circuit to transmit a program command sequence to the first chip-enable-signal controlled area through the channel. The program command sequence includes a first command and a second command, the first command is configured to instruct the first chip-enable-signal controlled area to write stored data and read operating temperature information, and in response to the transmission of the second command, the processor controls the control logic circuit to receive the operating temperature information from the first chip-enable-signal controlled area.

In some embodiments, the writing of the stored data is adjacent to the reading of the operating temperature information in time sequence.

In some embodiments, the second command includes a polling command.

In some embodiments, the flash memory further includes a second chip-enable-signal controlled area. After the processor controls the control logic circuit to transmit the first command to the first chip-enable-signal controlled area through the channel and before the second command is transmitted to the first chip-enable-signal controlled area, the processor controls the control logic circuit to transmit another first command to the second chip-enable-signal controlled area through the channel.

In some embodiments, the transmission of the first command is adjacent to a transmission of an address receiving command corresponding to the another first command in time sequence.

In some embodiments, after the processor controls the control logic circuit to receive the operating temperature information from the first chip-enable-signal controlled area, the processor controls the control logic circuit to transmit an address receiving command corresponding to a data programming command or an address receiving command corresponding to another first command to the first chip-enable-signal controlled area through the channel.

In some embodiments, the flash memory controller operates in a cache access mode.

In some embodiments, there is no command instructing the first chip-enable-signal controlled area to read another operating temperature information in another program command sequence transmitted before or after the program command sequence.

In some embodiments, the control logic circuit communicates with the flash memory using a communication protocol compatible with an Open NAND Flash Interface (ONFI).

In some embodiments, the first command and the second command are selected from a command set defined in an ONFI specification.

In a second aspect, the present disclosure also provides a data programming method executed by a flash memory controller coupled to a flash memory. The flash memory includes a first chip-enable-signal controlled area, the flash memory controller is coupled to the first chip-enable-signal controlled area of the flash memory through at least one channel to transmit data and commands. The data programming method includes: transmitting a first command to the first chip-enable-signal controlled area through the channel, where the first command is configured to instruct the first chip-enable-signal controlled area to write stored data and read operating temperature information; transmitting a second command to the first chip-enable-signal controlled area through the channel; and receiving the operating temperature information from the first chip-enable-signal controlled area in response to the transmission of the second command.

In some embodiments, the writing of the stored data is adjacent to the reading of the operating temperature information in time sequence.

In some embodiments, the first command is executed before the second command.

In some embodiments, the flash memory further includes a second chip-enable-signal controlled area. After the flash memory controller transmits the first command to the first chip-enable-signal controlled area through the channel and before the second command is transmitted to the first chip-enable-signal controlled area, the data programming method further includes: transmitting another first command to the second chip-enable-signal controlled area through the channel.

In some embodiments, the transmission of the first command is adjacent to a transmission of an address receiving command corresponding to the another first command in time sequence.

In some embodiments, after the flash memory controller receives the operating temperature information from the first chip-enable-signal controlled area, the data programming method further includes: transmitting an address receiving command corresponding to a data programming command or an address receiving command corresponding to another first command to the first chip-enable-signal controlled area through the channel.

In some embodiments, the flash memory controller operates in a cache access mode.

In some embodiments, the first command and the second command together form a program command sequence, and there is no command instructing the first chip-enable-signal controlled area to read another operating temperature information in another program command sequence transmitted before or after the program command sequence.

In some embodiments, the flash memory controller communicates with the flash memory using a communication protocol compatible with an Open NAND Flash Interface (ONFI).

In some embodiments, the first command and the second command are selected from a command set defined in an ONFI specification.

In comparison with the prior art, the present disclosure provides the flash memory controller and the data programming method, where the writing of the stored data and the acquisition of the operating temperature information can be realized by executing the program command sequence. Thus, time-consuming waiting for the completion of all channel operations is prevented and/or time consumption caused by having to end a cache program operation is prevented.

DETAILED DESCRIPTION

Exemplary embodiments of the present disclosure will now be described more fully with reference to the accompanying drawings. The exemplary embodiments may, however, be embodied in many forms and should not be construed as limited to the embodiments set forth herein. Rather, these embodiments are provided so that this disclosure will be thorough and complete, and will fully convey the scope of the disclosure to those skilled in the art. The drawings are merely schematic illustrations of the disclosure, and components in the drawings are not necessarily drawn to scale. The same reference numerals in the drawings denote the same or similar parts, and thus repeated descriptions thereof will be omitted.

Figure 1:
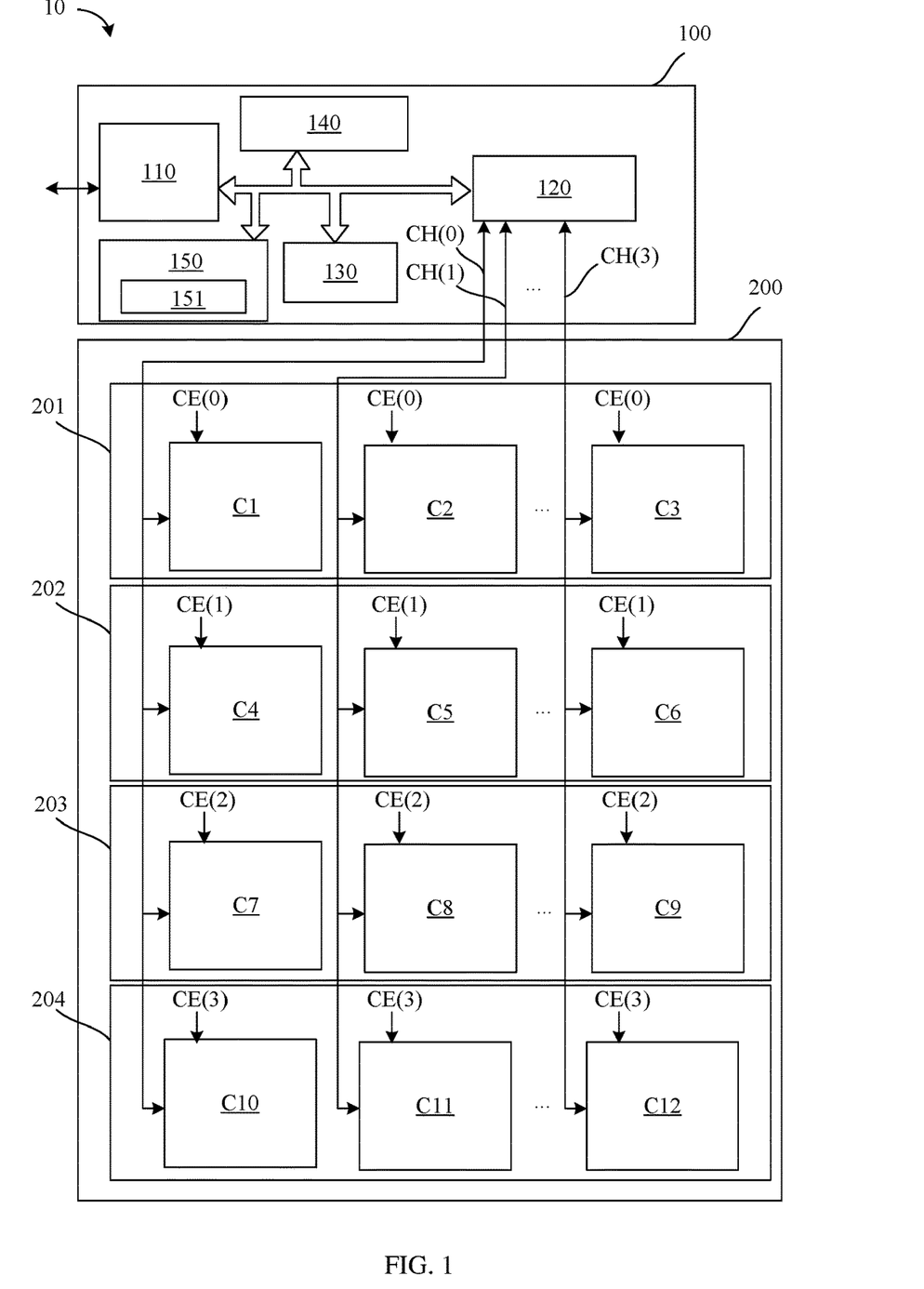
FIG. 1 illustrates a schematic diagram of a memory device of an embodiment of the present disclosure.

Referring to FIG. 1, which illustrates a schematic diagram of a memory device 10 of an embodiment of the present disclosure. The memory device 10 includes a flash memory controller 100 and a flash memory 200. The flash memory controller 100 is configured to control an operation of the memory device 10 and access the flash memory 200, and the flash memory 200 is configured to store data. The memory device 10 may include, but is not limited to, solid state drives (SSDs) and various types of embedded memory devices such as embedded memory devices conforming to Peripheral Component Interconnect Express (PCIe) standard.

As shown in FIG. 1, the flash memory controller 100 may include an interface logic circuit 110, a control logic circuit 120, a microprocessor 130, a buffer 140, and a read-only memory 150. The flash memory controller 100 can communicate with a host device through the interface logic circuit 110. Moreover, the flash memory controller 100 is coupled to the flash memory 200 via the control logic circuit 120. The microprocessor 130 is electrically coupled to the interface logic circuit 110, the control logic circuit 120, the buffer 140, and the read-only memory 150. The buffer 140 can be implemented by a random access memory (RAM). For example, the buffer 140 may be a static random access memory (Static RAM, SRAM), but the present disclosure is not limited thereto. The read-only memory 150 is configured to store codes 151.

In some embodiments, the flash memory controller 100 executing the codes 151 through the microprocessor 130 can use its own internal components to perform many control operations, for example, to communicate with the host device by using the interface logic circuit 110, to control the access of the flash memory 200 by using the control logic circuit 120, to perform required buffer processing by using the buffer 140, and so on. For example, the microprocessor 130 receives program (write/read) commands from the host device through the interface logic circuit 110, and accesses data in the flash memory 200 through the control logic circuit 120. The control logic circuit 120 may include an encoder and a decoder. The encoder is configured to encode the data written into the flash memory 200 to generate a corresponding check code, and the decoder is configured to decode the data received from the flash memory 200.

In some embodiments, the host device may include a processor and a power supply circuit coupled to each other. The processor can be configured to control the operation of the host device. The power supply circuit can be configured to provide power to the processor and the memory device 10, and output one or more driving voltages to the memory device 10. The memory device 10 can provide storage space to the host device and acquire the one or more driving voltages from the host device as power for the memory device 10. The host device referred to herein may include, but are not limited to, mobile devices, wearable devices, tablet computers, and personal computers such as desktop computers and notebook computers.

In some embodiments, the interface logic circuit 110 of the flash memory controller 100 can conform to a specific communication standard, such as Serial Advanced Technology Attachment (Serial ATA or SATA) standard, Peripheral Component Interconnect (PCI) standard, PCIe standard, Universal Flash Storage (UFS) standard, etc., and can communicate according to the specific communication standard, for example, communicate between the host device and the memory device 10. The host device may include a corresponding transmission interface circuit conforming to the specific communication standard for communication between the host device and the memory device 10.

In this embodiment, the flash memory 200 may be a NAND flash. Correspondingly, the control logic circuit 120 of the flash memory controller 100 communicates with the flash memory 200 using a communication protocol compatible with an Open NAND Flash Interface (ONFI). For example, the flash memory controller 100 can convert requests from the host device into commands for the flash memory 200 according to the ONFI protocol, where the commands are selected from a command set defined in an ONFI specification.

As shown in FIG. 1, the flash memory 200 may include a plurality of flash memory chips, such as chips C1, C2, . . . . CN, where N is a positive integer greater than 1. In this embodiment, it is taken that the flash memory 200 includes 12 chips as an example, but it is not limited thereto. Each chip C1-C12 of the flash memory 200 includes a plurality of blocks, and each block includes a plurality of pages. One page is usually the smallest unit of programming. In other words, one page is the smallest unit when writing or reading data. When accessing the data of one or more pages, the flash memory controller 100 will access the data of the one or more pages according to the preset access parameters, and perform a decoding operation on the data of the accessed pages.

In this embodiment, the host device can transmit host commands and corresponding logical addresses to the flash memory controller 100 to access the memory device 10. The flash memory controller 100 receives host commands and logical addresses, and converts the host commands into memory operation commands. The flash memory controller 100 further controls the flash memory 200 with the operation commands to perform operations, such as reading and/or writing (also known as programming), on memory units (such as data pages) of certain physical addresses in the flash memory 200. The physical addresses correspond to the logical addresses.

As shown in FIG. 1, the flash memory controller 100 accesses the flash memory 200 in parallel through multiple channels. In this embodiment, the control logic circuit 120 of the flash memory controller 100 includes four channels CH(0)-CH(3), and each channel is shared by four chips, but it is not limited thereto. The flash memory 200 includes a first chip-enable-signal controlled area 201, a second chip-enable-signal controlled area 202, a third chip-enable-signal controlled area 203, and a fourth chip-enable-signal controlled area 204. The control logic circuit 120 of the flash memory controller 100 is coupled to the first chip-enable-signal controlled area 201, the second chip-enable-signal controlled area 202, the third chip-enable-signal controlled area 203, and the fourth chip-enable-signal controlled area 204 of the flash memory 200 through the channels CH(0)-CH(3) to transmit data and commands. The processor 130 of the flash memory controller 100 transmits chip-enable signals CE(0)-CE(3) through the control logic circuit 120 to access the corresponding chip-enable-signal controlled area on the corresponding channel. Specifically, in this embodiment, the control logic circuit 120 uses several electronic signals to control the transmission of data and commands between the flash memory controller 100 and the flash memory 200, including data lines, clock signals, and control signals. The data lines can be configured to transmit commands, addresses, read and write data. The control signal line can be configured to transmit control signals, such as chip enable (CE), address latch enable (ALE), command latch enable (CLE), write enable (WE), and so on.

As shown in FIG. 1, the chip-enable signal CE(0) enables the chips C1-C3 on all channels CH(0)-CH(3) and disposed in the first chip-enable-signal controlled area 201. The chip-enable-signal CE(1) enables the chips C4-C6 on all channels CH(0)-CH(3) and disposed in the second chip-enable-signal controlled area 202. The chip-enable-signal CE(2) enables the chips C7-C9 on all channels CH(0)-CH(3) and disposed in the third chip-enable-signal controlled area 203. The chip-enable-signal CE(3) enables the chips C10-C12 on all channels CH(0)-CH(3) and disposed in the fourth chip-enable-signal controlled area 204. In this embodiment, the chip-enable signals CE(0), CE(1), CE(2), and CE(3) enables the chip-enable-signal controlled areas 201-204 in an interleaved way. The chip-enable-signal controlled areas 201-204 enabled by chip-enable-signals CE(0)-CE(3) are accessed in parallel through the plurality of channels CH(0)-CH(3).

It should be understood that the data quality of the blocks in the flash memory 200 will decrease as the temperature increases. In order to avoid unexpected errors or loss of data when executing read or write commands, an operating temperature of the flash memory 200 should be monitored to ensure that data access is performed when the temperature of the flash memory 200 is not higher than an allowable operating range. For example, the memory device 10 may be provided with a temperature sensor (not shown), but the present disclosure is not limited thereto. The temperature sensor can detect the temperature of the flash memory 200 at any time, and record a temperature value in its temporary register. When the flash memory controller 100 accesses the flash memory 200, the microcontroller 130 will command the flash memory 200 to send back the temperature value measured and recorded by the temperature sensor, so as to realize the temperature monitoring of the flash memory 200.

In this disclosure, one solution for acquiring the temperature of the flash memory 200 is to wait for a program operation of each channel to be completed before the flash memory controller 100 executes the temperature read operation. Moreover, the flash memory controller 100 will control the flash memory 200 to perform another program operation after waiting for the temperature information of each channel to be sent back. Specifically, refer to FIG. 2, which illustrates a timing diagram of a program operation according to a first embodiment of the present disclosure.

Figure 2:
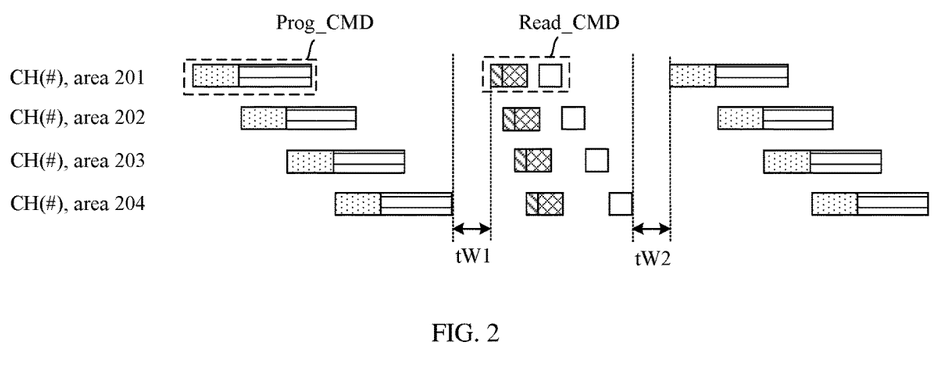
FIG. 2 illustrates a timing diagram of a program operation according to a first embodiment of the present disclosure.

In this embodiment, FIG. 2 illustrates the timing diagram showing the flash memory controller 100 performs the interleaved program operations on all chips in all chip-enable-signal controlled areas 201-204 at one channel CH(#). The flash memory controller 100 sequentially transmits a program command sequence to each chip-enable-signal controlled area 201-204. The program command sequence includes a first sub command sequence Prog_CMD and a second sub command sequence Read_CMD. In this embodiment, the first sub command sequence Prog_CMD is configured to instruct the flash memory 200 to perform a write operation related to data, and the second sub command sequence Read_CMD is configured to instruct the flash memory 200 to perform a read operation related to temperature. It should be understood that different patterns (e.g., dot, horizontal line, right slash, grid, etc.) filled in blocks of the timing diagram represent different execution commands/states, and the blocks with the same pattern represent the same execution commands/states.

Figure 3A:
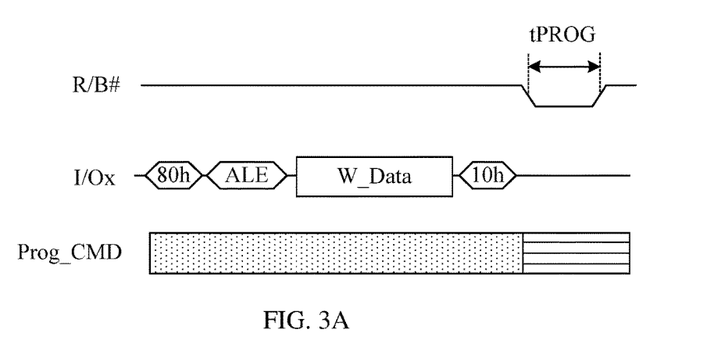
FIG. 3A illustrates a timing diagram for a first sub command sequence.

Specifically, refer to FIG. 3A, which illustrates a timing diagram for a first sub command sequence Prog_CMD, where I/Ox represents a data input/output signal of the flash memory controller 100 and the flash memory 200, and Ready/Busy # (R/B #) is configured to indicate that an operating status of the flash memory 200 is ready or busy. When the ready/busy (R/B) signal is at a low potential, it indicates that programming, erasing, or reading operations are in progress, and when the R/B signal is at a high potential, it indicates that the operation is completed. On the other hand, a period labeled W_Data in FIG. 3A represents that the flash memory controller 100 provides data to the corresponding chip of the flash memory 200 through the channel.

As shown in FIG. 3A, the first sub command sequence Prog_CMD is a normal write command sequence, including commands 80h and 10h. Specifically, the flash memory controller 100 transmits the command "80h" to the flash memory 200. The command "80h" is configured to instruct the flash memory 200 to receive address information ALE, i.e., an address receiving command. Then, the flash memory controller 100 transmits the address information ALE to the flash memory 200. Next, the flash memory controller 100 sequentially transmits the data W_Data to a page buffer of the corresponding chip of the flash memory 200. Finally, the flash memory controller 100 transmits the command "10h" to the flash memory 200. The command "10h" serves as the first command of the program command sequence in this embodiment, which instructs the flash memory 200 to start writing operation and sets the corresponding chip of the flash memory 200 to be in the busy status. Subsequently, the data in the page buffer of the chip is written to the page corresponding to the logical address in units of pages. In FIG. 3A, tPROG represents a period during which a write operation is performed, and the chip changes to the busy status during this period.

As shown in FIG. 2 and FIG. 3A, at one channel, the flash memory controller 100 transmits the first sub command sequence Prog_CMD (i.e., <80h-ALE-10h>) to the areas 201-204 sequentially. Then, after waiting for the execution of the first sub command sequence Prog_CMD of all channels to end (that is, waiting for all channels to complete operations and to be in the ready status), the flash memory controller 100 will sequentially transmit the second sub command sequence Read_CMD to areas 201-204. For example, in FIG. 2, tW1 represents the period of waiting for all channels to complete operations and to be in the ready status.

Figure 3B:
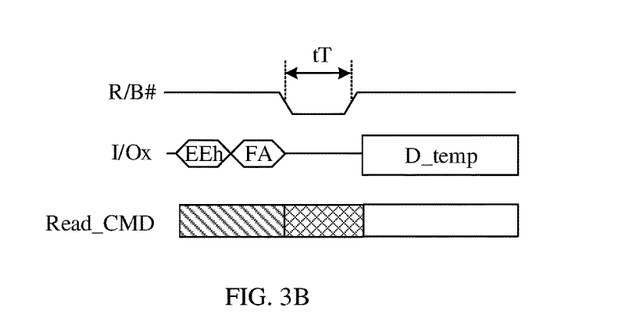
FIG. 3B illustrates a timing diagram for a second sub command sequence.

Referring to FIG. 3B, which illustrates a timing diagram for a second sub command sequence Read_CMD. The second sub command sequence Read_CMD includes commands EEh and FA. The flash memory controller 100 transmits the commands "EEh" and "FA" to the flash memory 200. The command "EEh" is the second command of the program command sequence in this embodiment, which is a get feature command, and the command "FA" indicates an address associated with feature. In this embodiment, the operating temperature information of the flash memory 200 is read as feature data. In FIG. 3B, tT represents a period during which the temperature of the flash memory 200 is measured, and the chip is busy during this period. Then, the flash memory controller 100 detects the end of the measurement operation of the operating temperature according to the R/B signal of the flash memory 200, and the flash memory controller 100 starts to receive the operating temperature information from the flash memory 200. For example, in FIG. 3B, the period labeled D_temp represents that the flash memory controller 100 receives the operating temperature information from the corresponding chip through the channel.

In some embodiments, the second sub command sequence Read_CMD may use different commands to acquire the operating temperature. For example, refer to FIG. 3C, which illustrates another timing diagram for the second sub command sequence Read_CMD. In this embodiment, the second sub command sequence Read_CMD includes a command 91h. The command "91h" serves as the second command of the program command sequence of this embodiment. The flash memory controller 100 transmits the command "91h" to the flash memory 200. Then, the flash memory controller 100 detects the completion of the operation temperature measurement according to the R/B signal of the flash memory 200, and the flash memory controller 100 starts to receive the operating temperature information from the flash memory 200.

Figure 3C:
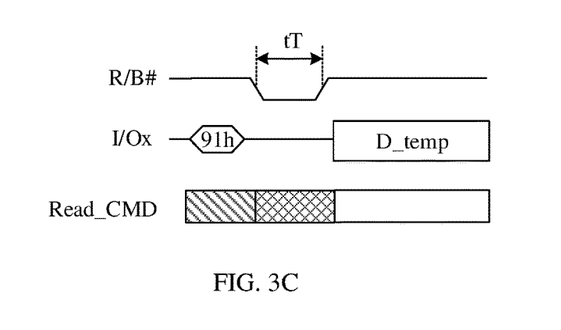
FIG. 3C illustrates another timing diagram for a second sub command sequence.

As shown in FIG. 2, FIG. 3B, and FIG. 3C, at one channel, the flash memory controller 100 transmits the commands "EEh" and "FA" or the command "91h" of the second sub command sequence Read_CMD to the areas 201-204 in sequence. Then, after the transmission of the commands "EEh" and "FA" or the command "91h" to the last area 204 is completed, the flash memory controller 100 starts to receive the operating temperature information D_temp from the areas 201-204 in sequence until the flash memory controller 100 receives the operating temperature information D_temp from the last area 204. Furthermore, the flash memory controller 100 can perform another program operation on the flash memory 200 after waiting for the execution of the second sub command sequence Read_CMD of all channels to be completed. For example, in FIG. 2, tW2 represents the period of waiting for all channels to complete operations and to be in the ready status.

In the present disclosure, the temperature monitoring of the flash memory 200 is realized through the interleaved program operations of the flash memory in the first embodiment. However, as shown in FIG. 2, the flash memory controller 100 can transmit the second sub command sequence Read_CMD to read the temperature after waiting for all channels to complete operations and the flash memory 200 to be in the ready status (the tW1 period). Also, the flash memory controller 100 can perform another program operation on the flash memory 200 only after the execution of the second sub command sequence Read_CMD of all channels is completed (the period tW2). Therefore, in this embodiment, the temperature read operation needs to spend a certain amount of time waiting for the flash memory 200 to be in the ready status. On the other hand, when the flash memory controller 100 operates in a cache access mode, if the second sub command sequence Read_CMD including the command "91h" is used to acquire the operating temperature, this method will disrupt the data on the register of the flash memory 200, resulting in interruption of the cache program operation. In view of this, the present disclosure also proposes another solution to make the flash memory that performs the program operation quickly return the operating temperature information without affecting the execution of the normal program operation.

Figure 4:
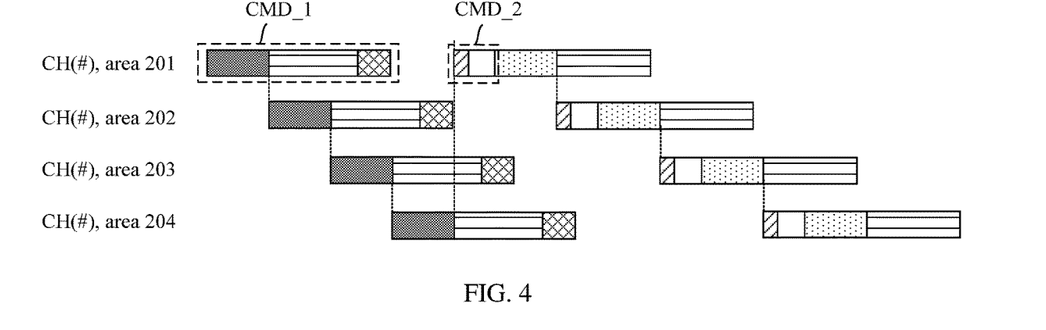
FIG. 4 illustrates a timing diagram of a program operation according to a second embodiment of the present disclosure.

Referring to FIG. 4, which illustrates a timing diagram of a program operation according to a second embodiment of the present disclosure. Specifically, FIG. 4 illustrates the timing diagram showing the flash memory controller 100 performs the interleaved program operations on all chips in all chip-enable-signal controlled areas 201-204 at one channel CH(#). The processor 130 of the flash memory controller 100 controls the control logic circuit 120 to transmit a program command sequence to the chip-enable-signal controlled areas 201-204 through the channel. The program command sequence includes a first sub command sequence CMD_1 and a second sub command sequence CMD_2. The first sub command sequence CMD_1 is executed before the second sub command sequence CMD_2. The first sub command sequence CMD_1 includes a first command, which is configured to instruct the corresponding chip-enable-signal controlled area to write stored data W_Data and read operating temperature information D_temp. The second sub command sequence CMD_2 includes a second command. In response to the transmission of the second command, the processor 130 of the flash memory controller 100 controls the control logic circuit 120 to receive the operating temperature information D_temp from the corresponding chip-enable-signal controlled area. It should be understood that different patterns (e.g., left slash, dot, horizontal line, grid, etc.) filled in blocks of the timing diagram represent different execution commands/states, and blocks with the same pattern represent the same or similar execution commands/states.

Figure 5:
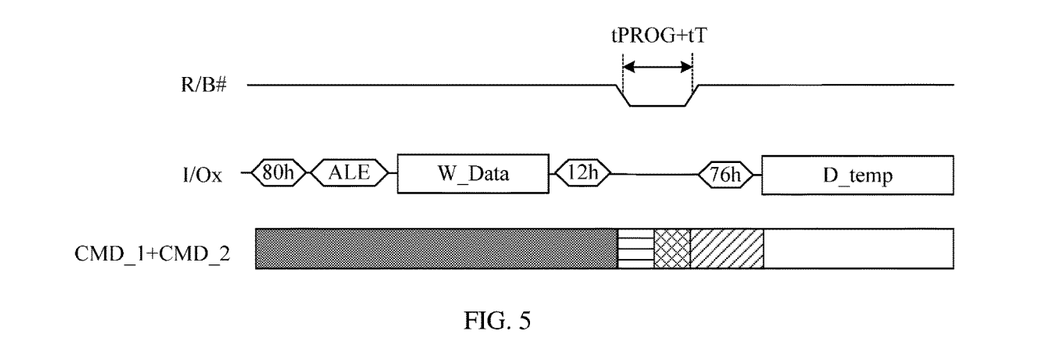
FIG. 5 illustrates a timing diagram for a program command sequence according to the second embodiment of the present disclosure.

Specifically, referring to FIG. 5, which illustrates a timing diagram for a program command sequence according to the second embodiment of the present disclosure, in which I/Ox represents a data input/output signal of the flash memory controller 100 and the flash memory 200, and R/B # is configured to indicate that an operating status of the flash memory 200 is ready or busy. When ready/busy (R/B) signal is low, it means programming, erasing, or read operation is in progress, and when the R/B signal is high, it means the operation is complete. On the other hand, a period labeled W_Data represents that the flash memory controller 100 provides data to the corresponding chip through the channel, and the period labeled D_temp represents that the flash memory controller 100 receives the operating temperature information of the corresponding chip through the channel.

As shown in FIG. 5, the first sub command sequence CMD_1 of the program command sequence includes commands 80h and 12h, and the command "12h" serves as the first command in this embodiment. It should be noted that the command "12h" is optional, for example, can be replaced by any command in the command set defined in the ONFI specification. The flash memory controller 100 transmits the command "80h" to the flash memory 200. The command "80h" is configured to instruct the flash memory 200 to receive address information ALE, that is, an address receiving command. The command "80h" transmitted through the channel is stored in a command register of the corresponding chip of the flash memory 200. Next, the flash memory controller 100 transmits the address information ALE to the flash memory 200. The address information ALE transmitted through the channel is stored in an address register of the corresponding chip of the flash memory 200. Next, the flash memory controller 100 sequentially transmits the stored data W_Data to a page buffer of the corresponding chip of the flash memory 200. Subsequently, the flash memory controller 100 transmits the command "12h" to the flash memory 200. The command "12h" is configured to instruct the flash memory 200 to start writing operation and set the corresponding chip of the flash memory 200 to be in the busy status, and is also configured to instruct to start measuring the operation temperature. The command "12h" transmitted via the channel is stored in the command register of the corresponding chip of the flash memory 200. If the command "12h" is stored in the register of the chip, the write and measurement operations are started, and the status changes to busy. In FIG. 5, tPROG represents the period during which the write operation is performed, and tT represents the period during which the measurement of the operating temperature information of the flash memory 200 is performed. In this embodiment, the writing of the stored data is adjacent to the reading of the operating temperature information in time sequence.

Based on the solution of the second embodiment of the present disclosure, alternatively, specific commands for enabling the operation of measuring temperature, such as (but not limited to) AAh, may be inserted at different positions in the program command sequence. The command "AAh" is optional, for example, it can be replaced by any command in the command set defined in the ONFI specification. For example, in some embodiments, the first sub command sequence CMD_1 includes commands 80h, AAh, and 10h. In a first example, the first sub command sequence CMD_1 includes a command sequence <AAh-80h-ALE-10h> in which the command "AAh" is inserted and transmitted before the command "80h". In a second example, the first sub command sequence CMD_1 includes a command sequence <80h-AAh-ALE-10h> in which the command "AAh" is inserted and transmitted between the command "80h" and address information. In a third example, the first sub command sequence CMD_1 includes a command sequence <80h-ALE-AAh-10h> in which the command "AAh" is inserted and transmitted between the address information and the command "10h". In a fourth example, the first sub command sequence CMD_1 includes a command sequence <80h-ALE-10h-AAh> in which the command "AAh" is inserted and transmitted after the command "10h". In other embodiments, the command "AAh" can be inserted and transmitted between the address information (such as between a logical column address and a logical row address), or it may be transmitted between any two valid data portions. It should be understood that, in the foregoing first to fourth examples, the commands "AAh" and "10h" together serve as the first command of the program command sequence in this embodiment.

As shown in FIG. 5, the second sub command sequence CMD_2 of the program command sequence includes, for example, a command 76h, where the command "76h" can be a polling command, and the command "76h" serves as the second command of the program command sequence of this embodiment. The flash memory controller 100 determines the completion of the write operation and the temperature measurement operation according to the R/B signal of the flash memory 200. Specifically, the flash memory controller 100 transmits the command "76h" to the flash memory 200. The command "76h" is configured to instruct the flash memory 200 to output the operating temperature information D_temp to the flash memory controller 100. It should be noted that, in this embodiment, the status of a ready bit is checked by the polling command, where the ready bit is a flag bit indicating whether the flash memory 200 is ready for operation. When the flash memory 200 is ready for read and write operations, the ready bit will be set to 1. Also, when the flash memory 200 is operating, the ready bit will be set to 0. That is, only when the ready bit is set to 1, the flash memory controller 100 will acquire the operating temperature information from the flash memory 200, thereby improving the reliability of the read operation and preventing data errors or other problems.

As shown in FIG. 4, the flash memory controller 100 sequentially transmits the first sub command sequence CMD_1 of the program command sequence to the first to fourth chip-enable-signal controlled areas 201 to 204 via the channel. Also, after the processor 130 of the flash memory controller 100 controls the control logic circuit 120 to transmit the first command "12h" of the first sub command sequence CMD_1 to the first chip-enable-signal controlled area 201 via the channel and before the second command "76h" of the second sub command sequence CMD_2 is transmitted to the first chip-enable-signal controlled area 201, the processor 130 of the flash memory controller 100 controls the control logic circuit 120 to transmit a first command of another first sub command sequence CMD_1 to another chip-enable-signal controlled area via the channel. Specifically, after the first command "12h" of the first sub command sequence CMD_1 is transmitted to the first chip-enable-signal controlled area 201, the flash memory controller 100 transmits another first sub command sequence CMD_1 (i.e., <80h-5ALE-12h>) to the second chip-enable-signal controlled area 202 via the channel. By analogy, after the flash memory controller 100 transmits another first sub command sequence CMD_1 (i.e., <80h-ALE-12h>) to the last chip-enable-signal controlled area (the fourth chip-enable-signal controlled area 204, the flash memory controller 100 transmits the second command "76h" of the second sub command sequence CMD_2 of the program command sequence to the first chip-enable-signal controlled area 201. That is, the transmission of the first command "12h" of the first sub command sequence CMD_1 to the first chip-enable-signal controlled area 201 is adjacent to the transmission of the address receiving command "80h" corresponding to the first command "12h" of another first sub command sequence CMD_1 to the second chip-enable-signal controlled area 202 in time sequence. Also, the transmission of the first command "12h" of the first sub command sequence CMD_1 to the fourth chip-enable-signal controlled area 204 is adjacent to the transmission of the second command "76h" of the second sub command sequence CMD_2 to the first chip-enable-signal controlled area 201 in time sequence.

In this embodiment, after the processor 130 of the flash memory controller 100 controls the control logic circuit 120 to receive the operating temperature information D_temp from the corresponding chip-enable-signal controlled area (such as the first chip-enable-signal controlled area 201), the processor 130 controls the control logic circuit 120 to transmit the address receiving command (e.g., 80h) corresponding to the data programming command (e.g., 10h) to the chip-enable-signal controlled area via the channel. In some embodiments, the processor 130 can also control the control logic circuit 120 to immediately transmit the address receiving command (e.g., 80h) corresponding to another first command (e.g., 12h) to the chip-enable-signal controlled area via a channel.

In the second embodiment of the present disclosure, the writing of the stored data W_Data and the reading of the operating temperature information D_temp can be realized by executing the program command sequence. Moreover, another program command can be followed immediately after the program command sequence is transmitted, thereby preventing the time-consuming waiting for the completion of all channel operations (i.e., waiting for the flash memory 200 to be in the ready status).

On the other hand, the following will describe how to acquire the operating temperature information of the flash memory 200 when the flash memory controller 100 operates in a cache access mode.

Figure 6:
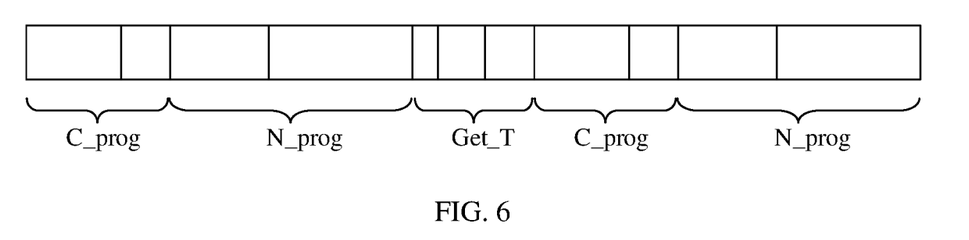
FIG. 6 illustrates a timing diagram of a program operation according to a third embodiment of the present disclosure.

Referring to FIG. 6, which illustrates a timing diagram of a program operation according to a third embodiment of the present disclosure, where the flash memory controller 100 operates in a cache access mode. In FIG. 6, the operation sequence of the flash memory controller 100 accessing a single chip-enable-signal controlled area through a single channel is illustrated. The flash memory controller 100 transmits various command sequences to instruct the flash memory 200 to perform corresponding read operations. The various command sequences include a cache program command sequence C_prog, a normal program command sequence N_prog, and a get temperature command sequence Get_T.

Figure 7A:
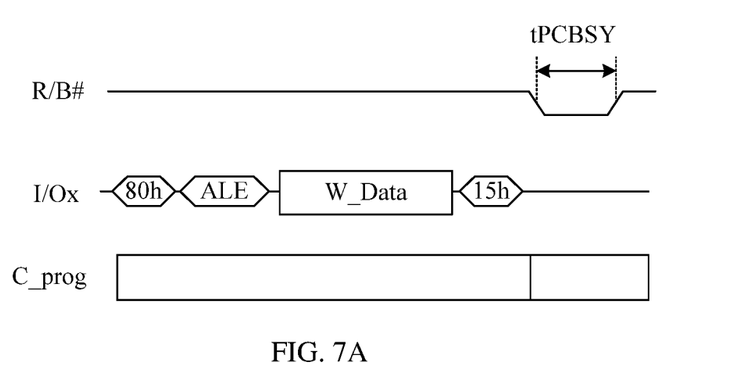
FIG. 7A illustrates a timing diagram for a command sequence C_prog.

As shown in FIG. 6, first, the flash memory controller 100 transmits the cache program command sequence C_prog to the flash memory 200. In this embodiment, the cache program command sequence C_prog is configured to instruct the flash memory 200 to execute a cache program operation. As shown in FIG. 7A, the cache program command sequence C_prog includes commands 80h and 15h. The command "15h" is configured to instruct the execution of the cache program operation, and the flash memory 200 receiving this command executes the corresponding program operation. In FIG. 7A, tPCBSY represents the period during which the cache write operation is performed.

Figure 7B:
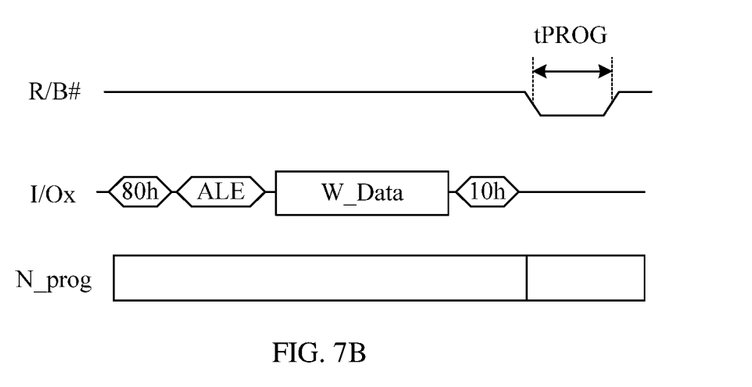
FIG. 7B illustrates a timing diagram for a command sequence N_prog.

As shown in FIG. 6, the flash memory controller 100 then transmits the normal program command sequence N_prog to the flash memory 200 to instruct the flash memory 200 to perform the normal program operation. That is, it is only configured to instruct the corresponding chip-enable-signal controlled area to write the stored data W_Data without reading the temperature information. As shown in FIG. 7B, the normal program command sequence N_prog is the same as the first sub command sequence Prog_CMD (that is, <80h-ALE-10h>) illustrated in FIG. 3A in the first embodiment, and will not be repeated here.

As shown in FIG. 6, the flash memory controller 100 then transmits the get temperature command sequence Get_T to the flash memory 200. In this embodiment, the get temperature command sequence Get_T is the same as the second sub command sequence Read_CMD illustrated in FIG. 3B or FIG. 3C in the first embodiment, it is configured to instruct the flash memory 200 to perform the read operation related to temperature, which will not be described in detail here.

In the present disclosure, the temperature monitoring of the flash memory 200 is realized through the program operation of the third embodiment. However, as shown in FIG. 6, the flash memory 200 will read specific bytes when reading the temperature. The cache data of these bytes may overwrite some bytes, thereby polluting the data in the cache. Therefore, in order to prevent the data in the cache from being polluted, it is necessary to end the cache program operation first, and execute a normal program operation (that is, execute the normal program command sequence N_prog), and then read the temperature. That is, the flash memory controller 100 can transmit the get temperature command sequence Get_T to read the temperature after the cache program operation must be completed and the flash memory 200 changes to the ready status. In this way, the cache access operation is interrupted and unnecessary time consumption is caused. In view of this, the present disclosure also proposes another solution to enable the flash memory executing the cache program operation to quickly return the operating temperature information without affecting the execution of the cache program operation.

Figure 8:
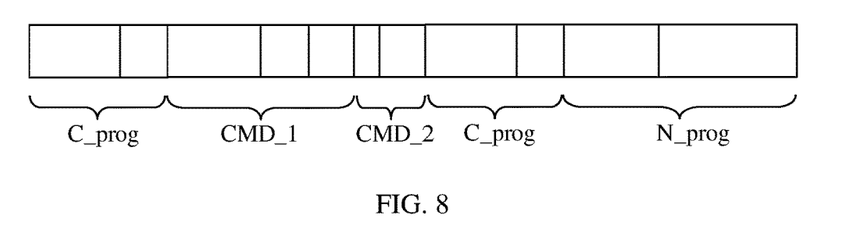
FIG. 8 illustrates a timing diagram of a program operation according to a fourth embodiment of the present disclosure.

Referring to FIG. 8, which illustrates a timing diagram of a program operation according to a fourth embodiment of the present disclosure, where the flash memory controller 100 operates in the cache access mode. In FIG. 8, the operation sequence of the flash memory controller 100 accessing a single chip-enable-signal controlled area through a single channel is illustrated. The flash memory controller 100 transmits various command sequences to instruct the flash memory 200 to perform corresponding access operations. The various command sequences include a cache program command sequence C_prog, a normal program command sequence N_prog, and a program command sequence, where the program command sequence includes a first sub command sequence CMD_1 and a second sub command sequence CMD_2.

As shown in FIG. 8, firstly, the flash memory controller 100 transmits to the cache program command sequence C_prog to the flash memory 200. In this embodiment, the cache program command sequence C_prog is configured to instruct the flash memory 200 to execute the cache program operation. The cache program command sequence C_prog in this embodiment is similar to the cache program command sequence C_prog in the third embodiment. Therefore, the cache program command sequence C_prog of this embodiment includes commands 80h and 15h (as shown in FIG. 7A). The command "15h" is configured to instruct the execution of the cache program operation, and the flash memory 200 receiving this command executes the corresponding program operation.

Figure 9:
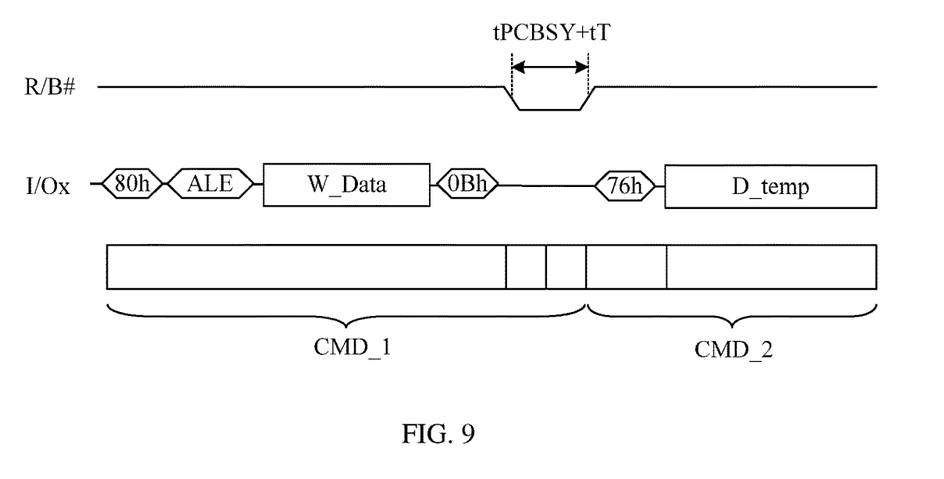
FIG. 9 illustrates a timing diagram for a program command sequence according to the fourth embodiment of the present disclosure.

As shown in FIG. 8, the processor 130 of the flash memory controller 100 then controls the control logic circuit 120 to transmit the program command sequence to the corresponding chip-enable-signal controlled area (such as the first chip-enable-signal controlled area 201) via the channel. Referring to FIG. 9, which illustrates a timing diagram for a program command sequence according to the fourth embodiment of the present disclosure. The program command sequence includes the first sub command sequence CMD_1 and the second sub command sequence CMD_2. The first sub command sequence CMD_1 is transmitted and executed before the second sub command sequence CMD_2. The first sub command sequence CMD_1 includes a first command, which is used to instruct the corresponding chip-enable-signal controlled area to write stored data W_Data and read operating temperature information D_temp. The second sub command sequence CMD_2 includes the second command. In response to the transmission of the second sub command sequence CMD_2, the processor 130 of the flash memory controller 100 controls the control logic circuit 120 to receive the operating temperature information D_temp from the corresponding chip-enable-signal controlled area.

As shown in FIG. 9, the first sub command sequence CMD_1 is <80h-ALE-0Bh>, where the command "0Bh" serves as the first command, which is configured to instruct the flash memory 200 to execute the cache program operation and to start measuring the operating temperature. The command "0Bh" is optional and may be replaced by any command in the command set defined in the ONFI specification. The command "0Bh" transmitted through the channel is stored in the command register of the corresponding chip of the flash memory 200. If the command "0Bh" is stored in the register of the chip, the data writing and temperature measurement operations are started, and the status changes to busy. In FIG. 9, tPCBSY represents the period during which the cache write operation is performed, and tT represents the period during which the operating temperature information of the flash memory 200 is measured. In this embodiment, the writing of the stored data is adjacent to the reading of the operating temperature information in time sequence.

It should be understood that, based on the solution of the fourth embodiment of the present disclosure, alternatively, specific commands for enabling the operation of measuring temperature, such as (but not limited to) AAh, may be inserted at different positions in the first sub command sequence CMD_1 of the program command sequence. The command "AAh" is optional, for example, it can be replaced by any command in the command set defined in the ONFI specification. For example, in some embodiments, the first sub command sequence CMD_1 includes commands 80h, AAh, and 15h. In a first example, the first sub command sequence CMD_1 is <AAh-80h-ALE-15h> in which the command "AAh" is inserted and transmitted before the command "80h". In a second example, the first sub command sequence CMD_1 is <80h-AAh-ALE-15h> in which the command "AAh" is inserted and transmitted between the command "80h" and address information. In a third example, the first sub command sequence CMD_1 is <80h-ALE-AAh-15h> in which the command "AAh" is inserted and transmitted between the address information and the command "15h". In a fourth example, the first sub command sequence CMD_1 is <80h-ALE-15h-AAh> in which the command "AAh" is inserted and transmitted after the command "15h". In other embodiments, the command "AAh" can be inserted and transmitted between the address information (such as between a logical column address and a logical row address), or it may be transmitted between any two valid data portions. It should be understood that, in the foregoing first to fourth examples, the commands "AAh" and "15h" together serve as the first command of the program command sequence in this embodiment.

On the other hand, the second sub command sequence CMD_2 is the same as the second sub command sequence CMD_2 in the second embodiment as illustrated in FIG. 5 (that is, including the second command "76h"), which will not be repeated here.

As shown in FIG. 8, after the processor 130 of the flash memory controller 100 controls the control logic circuit 120 to receive the operating temperature information from the corresponding chip-enable-signal controlled area (such as the first chip-enable-signal controlled area 201), the processor 130 controls the control logic circuit 120 to transmit an address receiving command corresponding to another cache program command sequence C_prog (such as command 80h) to the chip-enable-signal controlled area via the channel. In some embodiments, the processor 130 can also control the control logic circuit 120 to transmit an address receiving command corresponding to the first command "0Bh" of another program command sequence (such as the command 80h) to the chip-enable-signal controlled area via the channel. In some embodiments, there is no command instructing the corresponding chip-enable-signal controlled area to read another operating temperature information in another program command sequence transmitted before or after the program command sequence.

In the fourth embodiment of the present invention, the stored data can be written and the operating temperature information can be acquired by executing the program command sequence. Moreover, the program command sequence is transmitted immediately after the previous cache program command, which avoids the need to end the cache program operation first and cause time consumption.

The present disclosure also provides a data programming method executed by a flash memory controller coupled to a flash memory. The flash memory controller and flash memory are described above and will not be described in detail here. The flash memory controller is coupled to the first chip-enable-signal controlled area of the flash memory through at least one channel to transmit data and commands. Specifically, the microprocessor of the flash memory controller is usually configured to control the overall operation of the memory device. The microprocessor executes the codes and then executes all or part of the steps in the data programming method of the first embodiment to the fourth embodiment above.

Figure 10:
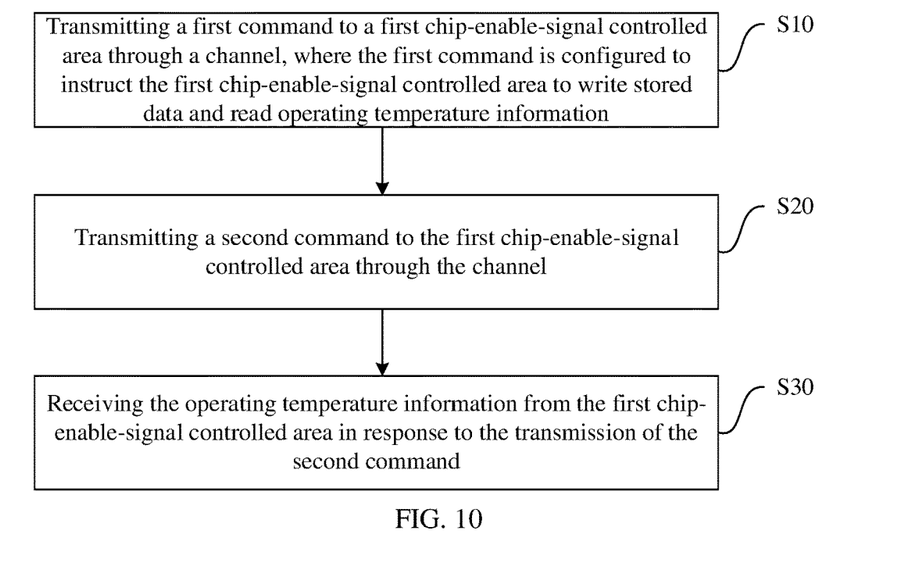
FIG. 10 illustrates a flowchart of a data programming method of the present disclosure.

Referring to FIG. 11, which illustrates a flowchart of a data programming method of the present disclosure. The data programming method includes at least step S10 to step S30. In the step S10, a first command is transmitted to the first chip-enable-signal controlled area through the channel, where the first command is configured to instruct the first chip-enable-signal controlled area to write stored data and read operating temperature information. In the step S20, a second command is transmitted to the first chip-enable-signal controlled area through the channel. In the step S30, the operating temperature information is received from the first chip-enable-signal controlled area in response to the transmission of the second command.

In some embodiments, the writing of the stored data is adjacent to the reading of the operating temperature information in time sequence.

In some embodiments, the first command is executed before the second command.

In some embodiments, the flash memory further includes a second chip-enable-signal controlled area. After the flash memory controller transmits the first command to the first chip-enable-signal controlled area through the channel and before the second command is transmitted to the first chip-enable-signal controlled area, the data programming method further includes a step of transmitting another first command to the second chip-enable-signal controlled area through the channel.

In some embodiments, the transmission of the first command is adjacent to a transmission of an address receiving command corresponding to the another first command in time sequence.

In some embodiments, after the flash memory controller receives the operating temperature information from the first chip-enable-signal controlled area, the data programming method further includes a step of transmitting an address receiving command corresponding to a data programming command or an address receiving command corresponding to another first command to the first chip-enable-signal controlled area through the channel.

In some embodiments, the flash memory controller operates in a cache access mode.

In some embodiments, the first command and the second command together form a program command sequence, and there is no command instructing the first chip-enable-signal controlled area to read another operating temperature information in another program command sequence transmitted before or after the program command sequence.

In some embodiments, the flash memory controller communicates with the flash memory using a communication protocol compatible with an Open NAND Flash Interface (ONFI).

In some embodiments, the first command and the second command are selected from a command set defined in an ONFI specification.

The above are only specific implementations of the present disclosure, but the protection scope of the present disclosure is not limited thereto. Any changes or replacements that can be easily devised by those skilled in the art within the technical scope of the present disclosure should all fall within the protection scope of the present disclosure. Therefore, the protection scope of the present disclosure should be defined by the protection scope of appending claims.

What is claimed is:

1. A flash memory controller for controlling a flash memory, wherein the flash memory comprises a first chip-enable-signal controlled area, the flash memory controller comprises:
a control logic circuit coupled to the first chip-enable-signal controlled area of the flash memory through at least one channel to transmit data and commands; and
a processor coupled to the control logic circuit to access the first chip-enable-signal controlled area on the channel through the control logic circuit, wherein the processor controls the control logic circuit to transmit a program command sequence to the first chip-enable-signal controlled area through the channel; and
wherein the program command sequence comprises a first command and a second command, the first command is configured to instruct the first chip-enable-signal controlled area to write stored data and read operating temperature information, and in response to the transmission of the second command, the processor controls the control logic circuit to receive the operating temperature information from the first chip-enable-signal controlled area.

2. The flash memory controller according to claim 1, wherein the writing of the stored data is adjacent to the reading of the operating temperature information in time sequence.

3. The flash memory controller according to claim 1, wherein the second command comprises a polling command.

4. The flash memory controller according to claim 1, wherein the flash memory further comprises a second chip-enable-signal controlled area; and
wherein after the processor controls the control logic circuit to transmit the first command to the first chip-enable-signal controlled area through the channel and before the second command is transmitted to the first chip-enable-signal controlled area, the processor controls the control logic circuit to transmit another first command to the second chip-enable-signal controlled area through the channel.

5. The flash memory controller according to claim 4, wherein the transmission of the first command is adjacent to a transmission of an address receiving command corresponding to the another first command in time sequence.

6. The flash memory controller according to claim 1, wherein after the processor controls the control logic circuit to receive the operating temperature information from the first chip-enable-signal controlled area, the processor controls the control logic circuit to transmit an address receiving command corresponding to a data programming command or an address receiving command corresponding to another first command to the first chip-enable-signal controlled area through the channel.

7. The flash memory controller according to claim 1, wherein the flash memory controller operates in a cache access mode.

8. The flash memory controller according to claim 1, wherein there is no command instructing the first chip-enable-signal controlled area to read another operating temperature information in another program command sequence transmitted before or after the program command sequence.

9. The flash memory controller according to claim 1, wherein the control logic circuit communicates with the flash memory using a communication protocol compatible with an Open NAND Flash Interface (ONFI).

10. The flash memory controller according to claim 9, wherein the first command and the second command are selected from a command set defined in an ONFI specification.

11. A data programming method executed by a flash memory controller coupled to a flash memory, wherein the flash memory comprises a first chip-enable-signal controlled area, the flash memory controller is coupled to the first chip-enable-signal controlled area of the flash memory through at least one channel to transmit data and commands, and the data programming method comprises:
    transmitting a first command to the first chip-enable-signal controlled area through the channel, wherein the first command is configured to instruct the first chip-enable-signal controlled area to write stored data and read operating temperature information;
    transmitting a second command to the first chip-enable-signal controlled area through the channel; and
    receiving the operating temperature information from the first chip-enable-signal controlled area in response to the transmission of the second command.

12. The data programming method according to claim 11, wherein the writing of the stored data is adjacent to the reading of the operating temperature information in time sequence.

13. The data programming method according to claim 11, wherein the first command is executed before the second command.

14. The data programming method according to claim 11, wherein the flash memory further comprises a second chip-enable-signal controlled area; and
    wherein after the flash memory controller transmits the first command to the first chip-enable-signal controlled area through the channel and before the second command is transmitted to the first chip-enable-signal controlled area, the data programming method further comprises:
    transmitting another first command to the second chip-enable-signal controlled area through the channel.

15. The data programming method according to claim 14, wherein the transmission of the first command is adjacent to a transmission of an address receiving command corresponding to the another first command in time sequence.

16. The data programming method according to claim 11, wherein after the flash memory controller receives the operating temperature information from the first chip-enable-signal controlled area, the data programming method further comprises:
    transmitting an address receiving command corresponding to a data programming command or an address receiving command corresponding to another first command to the first chip-enable-signal controlled area through the channel.

17. The data programming method according to claim 11, wherein the flash memory controller operates in a cache access mode.

18. The data programming method according to claim 11, wherein the first command and the second command together form a program command sequence, and there is no command instructing the first chip-enable-signal controlled area to read another operating temperature information in another program command sequence transmitted before or after the program command sequence.

19. The data programming method according to claim 11, wherein the flash memory controller communicates with the flash memory using a communication protocol compatible with an Open NAND Flash Interface (ONFI).

20. The data programming method according to claim 19, wherein the first command and the second command are selected from a command set defined in an ONFI specification.

* * * * *